United States Patent [19]

Schultz

[11] Patent Number: 4,599,548
[45] Date of Patent: Jul. 8, 1986

[54] PWM CONTROLLER FOR AN ELECTRICAL LOAD

[75] Inventor: Warren J. Schultz, Tempe, Ariz.

[73] Assignee: Motorola Inc., Schaumburg, Ill.

[21] Appl. No.: 713,129

[22] Filed: Mar. 18, 1985

[51] Int. Cl.⁴ .................... G05B 11/28; H02P 1/22
[52] U.S. Cl. .................... 318/599; 318/257; 318/139; 318/434; 318/317; 318/341; 318/334
[58] Field of Search .............. 318/314, 318, 317, 329, 318/341, 345 R, 345 E, 414, 415, 416, 417, 599, 600, 601, 606, 607, 608, 609, 628, 634, 635, 139, 626, 332, 334, 345 A, 345 CA, 345 AB, 345 B, 430, 432, 431, 433, 434, 471, 474, 257, 258; 363/124, 39

[56] References Cited

U.S. PATENT DOCUMENTS

| | | | |
|---|---|---|---|
| 3,569,809 | 3/1971 | Comer | 318/338 |
| 3,700,987 | 10/1972 | Deering | 318/341 X |
| 4,020,402 | 4/1977 | Storm | 318/341 X |
| 4,037,145 | 7/1977 | Bailey et al. | 318/341 |
| 4,189,666 | 2/1980 | Tetsugu et al. | 318/334 |
| 4,217,526 | 8/1980 | Farr | 318/139 |
| 4,222,100 | 9/1980 | Jones | 363/124 |
| 4,230,977 | 10/1980 | Nelson | 318/434 X |
| 4,250,441 | 2/1981 | Chapman et al. | 318/626 |
| 4,295,080 | 10/1981 | Fujita et al. | 318/257 |
| 4,344,124 | 8/1982 | Panicali | 363/49 |
| 4,375,611 | 3/1983 | Greig | 318/626 |
| 4,412,158 | 10/1983 | Jefferson et al. | 318/345 C X |
| 4,456,859 | 6/1984 | Watanabe et al. | 318/345 G X |
| 4,459,651 | 7/1984 | Fenter | 363/49 X |
| 4,463,296 | 7/1984 | Tada et al. | 318/474 X |
| 4,471,276 | 9/1984 | Cudlitz | 318/341 |
| 4,481,448 | 11/1984 | Bishop | 318/345 D X |
| 4,494,057 | 1/1985 | Hotta | 318/334 X |
| 4,524,309 | 6/1985 | Hisatake et al. | 318/434 |

Primary Examiner—William M. Shoop, Jr.
Assistant Examiner—Shik Luen Paul Ip
Attorney, Agent, or Firm—William J. Kubida; Dale E. Jepsen

[57] ABSTRACT

A PWM controller for an electrical utilizes a dual differential input topology comprising two input comparators deriving a proportional reference from two potentiometers for providing a variable pulse width modulated output. The pulse width modulation controller of the present invention does not require scaling and may be utilized in appliances, robotics, toys and in conjunction with other electromechanical and electrical loads.

14 Claims, 6 Drawing Figures

PWM CONTROLLER FOR AN ELECTRICAL LOAD

BACKGROUND OF THE INVENTION

The present invention relates, in general, to the field of pulse width modulation (PWM) controllers for an electrical load. More particularly, the present invention relates to a PWM controller for a DC motor in which motor speed and PWM frequency are each respectively controlled with a single ground referenced input utilizing a dual differential input topology.

Conventional PWM controller integrated circuits (IC's) generally employ a reference voltage and a fixed ramp to control power by pulse width modulation. This technique has proven satisfactory for closed loop systems such as those encountered in switching power supplies. However, in applications such as motor drives, this conventional approach has proved overly cumbersome and existing IC's necessitate complex and excessive arrays of external devices.

In most applications, in particular those involving electromechanical electrical loads such as DC motors, it would be highly desirable to merely connect a potentiometer to the input of a PWM IC and the motor to the output without the addition of numerous and complex external components. Still further, the output power of the device should be proportional to a single ground referenced input without the need for scaling found in conventional controls which have heretofore consisted primarily of a combination of signal IC's, discrete resistors and capacitors, discrete power transistors or discrete power diodes. By utilizing a duty cycle proportional to a ground referenced input, the control function can then be accomplished by merely adding a potentiometer or a digital-to-analog (D/A) converter to the IC front end.

Other desirable features of a PWM controller would include having a duty cycle fully variable from 0% to 100%. Heretofore, the duty cycle range in most conventional PWM IC's is deliberately restricted. However, and as is particularly the case with motor drives, it is desirable to fully stop the motor in addition to running it at full speed. It is further highly desirable to control the frequency with a single ground referenced input voltage. Frequencies on the order of 200 hertz to 1 kilohertz are a typical range. This feature is especially important in motor drives since motor torque and chatter are controlled by varying frequency. Additionally, current limiting and over-temperature protection would also be highly desirable in a PWM controller. In the former instance, stall current up to ten times the rated operating current or shorts across the motor terminals may be encountered. Over-temperature shutdown can also serve to protect both the drive and the motor when such conditions are present.

Still further, a PWM controller should have a standby current drain less than one milliamp or, more preferably, 100 microamps. A negligibly low current drain allows the motor to be turned off via the control function of a potentiometer, D/A converter etc., without the necessity of utilizing an on/off switch and without significantly draining the power source, which may in some instances be a battery. Additionally, a pulse width modulation controller should be readily integrated onto a semiconductor substrate such that it would include a minimum number of I/O pins while simultaneously requiring a minimum number of external components. In many applications, and in particular portable battery powered motor applications, there may not be a convenient printed circuit (PC) board to absorb additional external components or a complex integrated circuit package.

SUMMARY OF THE INVENTION

It is therefore an object of the present invention to provide an improved PWM controller for an electrical load.

It is further an object of the present invention to provide an improved PWM controller for an electrical load which utilizes a dual differential input topology in which motor speed may be controlled by a single ground referenced input without the requirement of scaling and also control PWM frequency with a ground referenced input.

It is still further an object of the present invention to provide an improved PWM controller for an electrical load which is readily and economically effectuated and may be conveniently integrated on a semiconductor substrate having a minimum number of I/O pins.

It is still further an object of the present invention to provide an improved PWM controller for an electrical load which provides a duty cycle variable from 0 to 100% with output power proportional to a ground referenced input.

It is still further an object of the present invention to provide an improved PWM controller for an electrical load which provides current limit and overvoltage protection while having a low standby current drain.

The foregoing and other objects are achieved in the present invention wherein there is provided a PWM controller comprising a variable voltage level determining circuit for establishing a variable voltage level. Circuitry coupled to the variable voltage level determining circuit develops a variable voltage level thereat. Additional circuitry is provided for coupling an electrical load between a load voltage line and a reference voltage line when the variable voltage level reaches a first predetermined level. Circuitry is also provided for discharging the variable voltage determining circuit when the variable voltage level reaches a second predetermined level.

Also provided is an electrical load driving circuit which comprises a PWM controller coupling a supply voltage line to a reference voltage line and having first and second input voltage lines and an output voltage line thereof, the first input voltage line being coupled to the supply voltage line. Voltage dividing circuitry couples the supply and reference voltage lines and has a variable voltage output thereof coupled to the second voltage input line. An electrical load couples the supply and output voltage lines whereby the electrical load may be pulse width modulated in response to the voltage dividing means.

In a more specific embodiment of the present invention, a controller comprises first, second and third comparators having respective inverting and noninverting inputs and an output thereof. The first inverting and the second non-inverting inputs define first and second input voltage lines respectively. The first non-inverting input is coupled to the second and third inverting inputs defining a current node and the third non-inverting input is coupled to an offset voltage source with respect to a reference voltage line. A latching circuit has set, reset and output terminals thereof, the set and reset terminals being coupled to the outputs of the first and third comparators respectively. First and second switching devices have respective first and second current carrying electrodes and a control electrode thereof. The latching circuit output terminal and the output of the second comparator are coupled to the control electrodes of the first and second switching devices respectively, each having the first current carrying electrodes thereof coupled to the reference voltage line and the second current carrying electrodes coupled to the current node and an output voltage line respectively. A current source couples a supply voltage line to the current node and a capacitor couples the current node to the reference voltage line.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
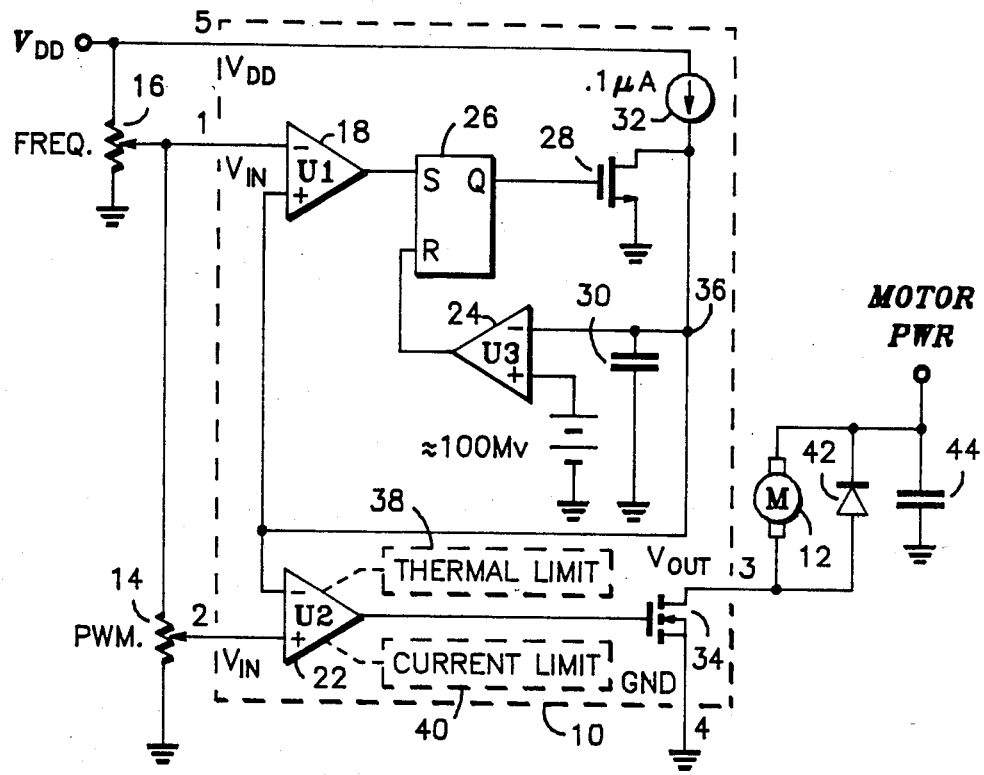
FIG. 1 is a schematic representation of a PWM controller in accordance with the present invention for driving an electrical load such as a DC motor and having as inputs a pair of voltage dividers comprising potentiometers, and showing the I/O pins to an integrated circuit embodiment thereof.

With reference to FIG. 1, a PWM controller 10 is shown. PWM controller 10 may be readily integrated on a semiconductor substrate having but 5 input/output (I/O) pins and conveniently packaged in any number of manners such as a common TO-220 package. Alternatively, PWM controller 10 may be fabricated utilizing various discrete components.

PWM controller 10 maybe used for providing a pulse width modulation drive for motor 12. PWM controller 10 requires only a single PWM potentiometer 14 at its input pin 2 to provide power and speed control of motor 12 as will be more fully described hereinafter. However, PWM controller 10 may also comprise an additional frequency potentiometer 16 at its number 1 input thereof for controlling frequency of operation. Although pin 1 may be tied to a source of supply voltage, the use of frequency potentiometer 16 allows for alteration of the low speed torque characteristics of motor 12.

A source of supply voltage ($V_{DD}$) is connected to pin 5 of PWM controller 10 and one terminal of frequency potentiometer 16 having another terminal thereof connected to a reference voltage line. Frequency potentiometer 16 functions as a voltage divider having a variable tap connected to a first ($V_{IN1}$) input voltage line connected to an inverting input of comparator 18. Frequency potentiometer 16 is utilized to set a second predetermined voltage level as will be more fully described hereinafter. PWM potentiometer 14 has one terminal connected to the first input voltage line $V_{IN1}$ and another terminal coupled to a reference voltage line or circuit ground. A variable tap is connected to a non-inverting input of comparator 22 defining a second input voltage line $V_{IN2}$. PWM potentiometer 14 also functions as a voltage divider for setting a first predetermined voltage level as will be more fully described hereinafter. As shown, a source of $V_{DD}$ is connected to pin 5 input of PWM controller 10. Comparator 18 has its non-inverting input coupled to the inverting input of comparator 22. Comparators 18 and 22 have common mode ranges including $V_{DD}$ and circuit ground respectively. The common connection of the non-inverting input of comparator 18 and the inverting input of comparator 22 define a current node 36.

The output of comparator 18 is connected to the set input of RS latch 26 having its Q output connected to the gate of MOSFET 28. MOSFET 28 has its drain terminal connected to node 36 and its source terminal connected to a reference voltage line or circuit ground. Current source 32 is connected to the supply voltage line $V_{DD}$. Capacitor 30 couples node 36 to circuit ground as shown and is utilized to determine a variable voltage level thereat. Current source 32 changes capacitor 30 to establish the variable voltage level. Comparator 24 has its inverting input coupled to node 36 and its non-inverting input connected to an offset voltage of approximately 100 mV. The output of comparator 24 is applied as an input to the reset input of RS latch 26. Output of comparator 22 is utilized to drive the gate of power transistor 34 as shown. The source terminal of power transistor 34 is connected to circuit ground while the drain terminal functions as the output of PWM controller 10 for supplying a pulse width modulated output of approximately 100 hertz/volt on an output voltage line $V_{OUT}$ at pin 3. Additionally, comparator 22 in an integrated circuit version thereof may include a thermal limit circuit 38 and current limit circuit 40. Thermal limit circuit 38 will provide a limit at approximately 125° C. while current limit circuit 40 provides an output limit of approximately 20 amps.

Operation of motor 12, which may be a universal DC motor wherein the motor speed is directly proportional to the applied voltage, requires only an additional freewheeling diode 42 in parallel therewith having its cathode connected to a motor power supply line. The anode terminal of diode 42 is connected to the output voltage line of PWM controller at pin 3. An additional capacitor 44 may be utilized to couple the motor power line to circuit ground as shown.

Figure 2:
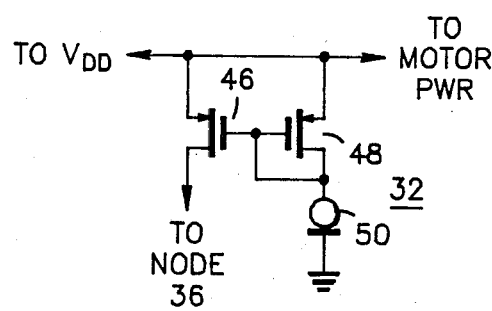
FIG. 2 is a current source for possible utilization in a PWM controller in accordance with the present invention.

Referring additionally now to FIG. 2, a discrete device embodiment for current source 32 is shown. 10 Current source 32 may comprise MOSFET 46 having its source terminal connected to supply voltage line $V_{DD}$ and its drain connected to node 36. In like manner, MOSFET 48 has its source terminal connected to $V_{DD}$ and its drain connected to the common connected gates of MOSFET 46 and 48. The common connected gates of MOSFET's 46, 48 are coupled to circuit ground by means of current reference diode 50. In utilizing the embodiment of current source 32 shown, motor power for motor 12 may be taken directly from the supply voltage $V_{DD}$.

In the embodiments above described, comparators 18, 22 and 24 may be supplied as a portion of an MC14574 quad CMOS programmable comparator available from Motorola, Inc., assignee of the present invention although a common mode $=V_{IN}$ requirement is desired in an integrated circuit version. RS latch 26 may be a portion of a MC14043 quad NOR RS latch likewise available from Motorola, Inc. MOSFET 28 may be a TMOS™ MPF-930 while power transistor 34 may be an MTH35N05 TMOS™ device likewise available from Motorola. In an integrated circuit embodiment, capacitor 30 will have a rating of approximately 100 pf while current source 32 will supply approximately 0.1 microamps. In a discrete component version capacitor 30 will be approximately 100 nf and current source 32 will supply about 220 microamps. Diode 42 may be an MUR1505 ultrafast rectifier while capacitor 44 has a value of approximately 500 microfarads. MOSFET's 46 and 48 may be MFE3003 low frequency low noise devices while diode 50 may be a 1N5284 field effect current regulator diode.

Figure 3:
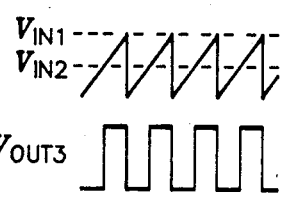
FIG. 3 illustrates conventional input and output voltage waveforms for the PWM controller of FIG. 1.

Referring additionally to FIG. 3, the operation of PWM controller 10 is shown. PWM potentiometer 14 is utilized to establish a first reference voltage level $V_{IN2}$ while frequency potentiometer 16 is utilized to establish a second higher predetermined voltage level $V_{IN1}$. Upon application of a source of $V_{DD}$ to PWM controller 10, current source 32 functions to charge capacitor 30. When a level of $V_{IN2}$ is reached at node 36, comparator 22 will then have the same voltage level at its inverting and non-inverting inputs. Thereupon, a driving signal will be applied to the gate of power transistor 34 turning the device off and raising the voltage at its drain to a level of $V_{OUT}$ with respect to circuit ground.

As capacitor 30 continues to charge, node 36 will rise to a level of $V_{IN1}$, whereupon reaching this level, comparator 18 will apply an output signal to the set input of RS latch 26 which is passed to its Q output turning on MOSFET 28 thereby discharging capacitor 30 and current source 32 to circuit ground. Upon reaching the reference voltage level at node 36, comparator 24 supplies an output to the rest input of RS latch 26 thereby disconnecting current source 32 and capacitor 30 from circuit ground allowing capacitor 30 to again recharge a level of $V_{IN2}$. As node 36 is discharged to circuit ground, the output of comparator 22 turns on power transistor 34 lowering $V_{OUT}$ to the reference voltage level.

Compared to the conventional reference voltage and fixed ramp approach, the complexity of PWM controller 10 is removed by its dual differential input topology. Ramp height automatically adjusts to the input voltage $V_{IN1}$ eliminating the reference voltage and permitting a simple potentiometer adjustment to control duty cycle. Since capacitor 30 charges at a constant rate, changing the ramp height also changes frequency. Therefore, frequency is variable by varying the input voltage at pin 1. This characteristic is important in some motor drive applications since motor torque is a function of frequency.

Figure 4A:
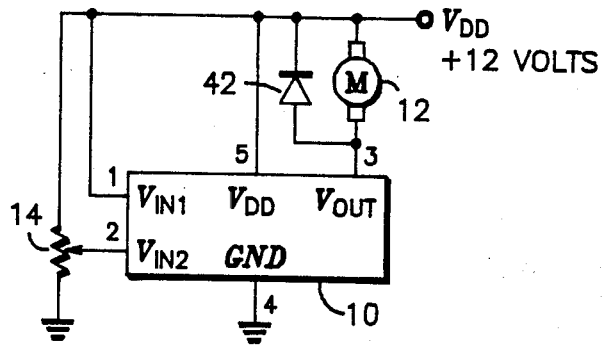
FIGS. 4A–4C illustrate various applications for the PWM controller of FIG. 1 in driving an electrical load such as an electromechanical DC motor.
Figure 4B:
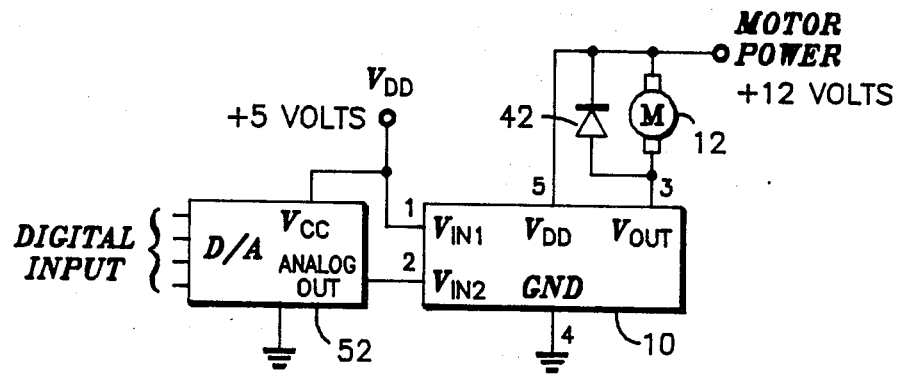
Figure 4C:
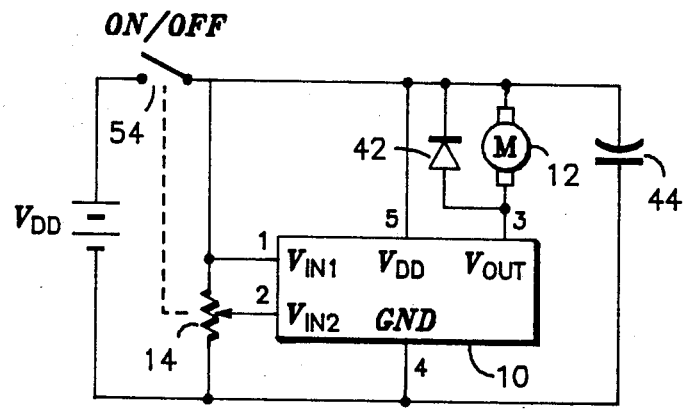

Referring additionally now to FIGS. 4A, 4B, and 4C, if $V_{IN1}$ is tied to a fixed supply voltage only PWM potentiometer 14 and free wheeling diode 42 are required to operate motor 12. Duty cycle is set by the ratio of $V_{IN2}/V_{IN1}$ and is variable over a 0-100% range. This topology also facilitates connection to a digital/analog (D/A converter) in microprocessor based control systems. The D/A supply voltage can be tied to $V_{IN1}$ thereby automatically matching the 0-100% range on the D/A with 0-100% duty cycle in the drive. An example of a D/A input functioning as a voltage divider to PWM controller 10 is shown utilizing D/A converter 52 as shown in FIG. 4B. FIG. 4C illustrates the use of an SPST switch 54 to disconnect the supply voltage source $V_{DD}$ in certain applications.

What has been provided therefore, is an improved PWM controller for an electrical load which utilizes a dual differential input topology in which motor speed may be controlled by a single ground referenced input without the requirement of scaling and PWM frequency may also be controlled with a single ground referenced input. The circuit of the present invention is readily and economically effectuated and may be conveniently integrated on a semiconductor substrate having a minimum number if I/O pins. The PWM controller of the present invention provides a duty cycle variable from 0-100% with output power proportional to a ground referenced input and provides current limit and overvoltage protection while having a low standby current drain. The PWM controller disclosed may also be adapted for use as a switching regulator with suitable external components.

While there have been described above the principles of the present invention in conjunction with specific circuitry, it is to be clearly understood that the foregoing description is made only by way of example and not as a limitation to the scope of the invention. It should be noted that the use of TMOS™ output power transistor can be changed to provide for motors other loads of varying sizes when coupled with a suitably buffered output of the driving comparator.

What is claimed is:

1. A pulse width modulation controller comprising:
   first, second and third comparators having respective inverting and non-inverting inputs and an output thereof, said inverting input of said first comparator and said non-inverting input of said second comparator defining first and second input voltage lines respectively, said non-inverting input of said first comparator being coupled to said inverting inputs of said second and third comparators defining a current node and said non-inverting input of said third comparator being coupled to an offset voltage source with respect to a reference voltage line;
   latching means having set, reset and output terminals thereof, said set and reset terminals being coupled to said output of said first and third comparators respectively.
   first and second switching means having respective first and second current carrying electrodes and a control electrode thereof, said latching means output terminal and said output of said second comparator being coupled to said control electrodes of said first and second switching means respectively, each having said first current carrying electrodes thereof coupled to said reference voltage line and said second current carrying electrodes coupled to said current node and an output voltage line respectively;
   a current source coupling a supply voltage line to said current node; and
   a capacitor coupling said current node to said reference voltage line.

2. The pulse width modulation controller of claim 1 further comprising:
   first voltage dividing means coupling said supply and reference voltage lines and having an intermediate terminal thereof coupled to said first input voltage line; and second voltage dividing means coupling said first input and reference voltage lines and having an intermediate terminal thereof coupled to said second input voltage line.

3. The pulse width modulation controller of claim 1 further comprising:
an electrical load coupling said output voltage line to a load voltage source.

4. The pulse width modulation controller of claim 3 wherein said load voltage source comprises said supply voltage line.

5. The pulse width modulation controller of claim 3 further comprising:
a diode in parallel with said electrical load.

6. The pulse width modulation controller of claim 3 wherein said electrical load is an electromechanical device.

7. The pulse width modulation controller of claim claim 6 wherein said electromechanical device is a DC motor.

8. The pulse width modulation controller of claim 3 further comprising a capacitor coupling said load voltage source to said reference voltage line.

9. The pulse width modulation controller of claim 1 further comprising:
voltage dividing means coupling said supply and reference voltage lines and having a variable voltage output thereof coupled to said second voltage input line.

10. The pulse width modulation controller of claim 9 wherein said voltage dividing means comprises a variable resistance.

11. The pulse width modulation controller of claim 9 wherein said voltage dividing means comprises a digital-to-analog converter.

12. The pulse width modulation controller of claim 1 wherein said controller comprises an integrated circuit.

13. The pulse width modulation controller of claim 1 further comprising a thermal limit sensor.

14. The pulse width modulation controller of claim 1 further comprising a current limit sensor.

* * * * *